(12) United States Patent
Hsieh

(10) Patent No.: US 8,067,800 B2
(45) Date of Patent: Nov. 29, 2011

(54) SUPER-JUNCTION TRENCH MOSFET WITH RESURF STEP OXIDE AND THE METHOD TO MAKE THE SAME

(75) Inventor: Fu-Yuan Hsieh, Banciao (TW)

(73) Assignee: Force Mos Technology Co., Ltd., Banciao (TW)

( * ) Notice: Subject to any disclaimer, the term of this patent is extended or adjusted under 35 U.S.C. 154(b) by 169 days.

(21) Appl. No.: 12/654,637

(22) Filed: Dec. 28, 2009

(65) Prior Publication Data
US 2011/0156139 A1 Jun. 30, 2011

(51) Int. Cl.
*H01L 29/66* (2006.01)
(52) U.S. Cl. ........... 257/331; 257/E21.41; 257/E29.256; 438/270
(58) Field of Classification Search .................. 257/331, 257/339, E21.41, E29.256; 438/270
See application file for complete search history.

(56) References Cited

U.S. PATENT DOCUMENTS
6,982,459 B2 * 1/2006 Suzuki et al. ................. 257/329
2006/0065923 A1 * 3/2006 Pfirsch ......................... 257/328

FOREIGN PATENT DOCUMENTS
JP 2008-227533 * 9/2008
* cited by examiner

*Primary Examiner* — A. Sefer
*Assistant Examiner* — Monica D Harrison
(74) *Attorney, Agent, or Firm* — Bacon & Thomas, PLLC

(57) ABSTRACT

A super-junction trench MOSFET with Resurf Stepped Oxide is disclosed. The inventive structure can apply additional freedom for better optimization and manufacturing capability by tuning thick oxide thickness to minimize influence of charge imbalance, trapped charges, etc. . . . . Furthermore, the fabrication method can be implemented more reliably with lower cost.

18 Claims, 17 Drawing Sheets

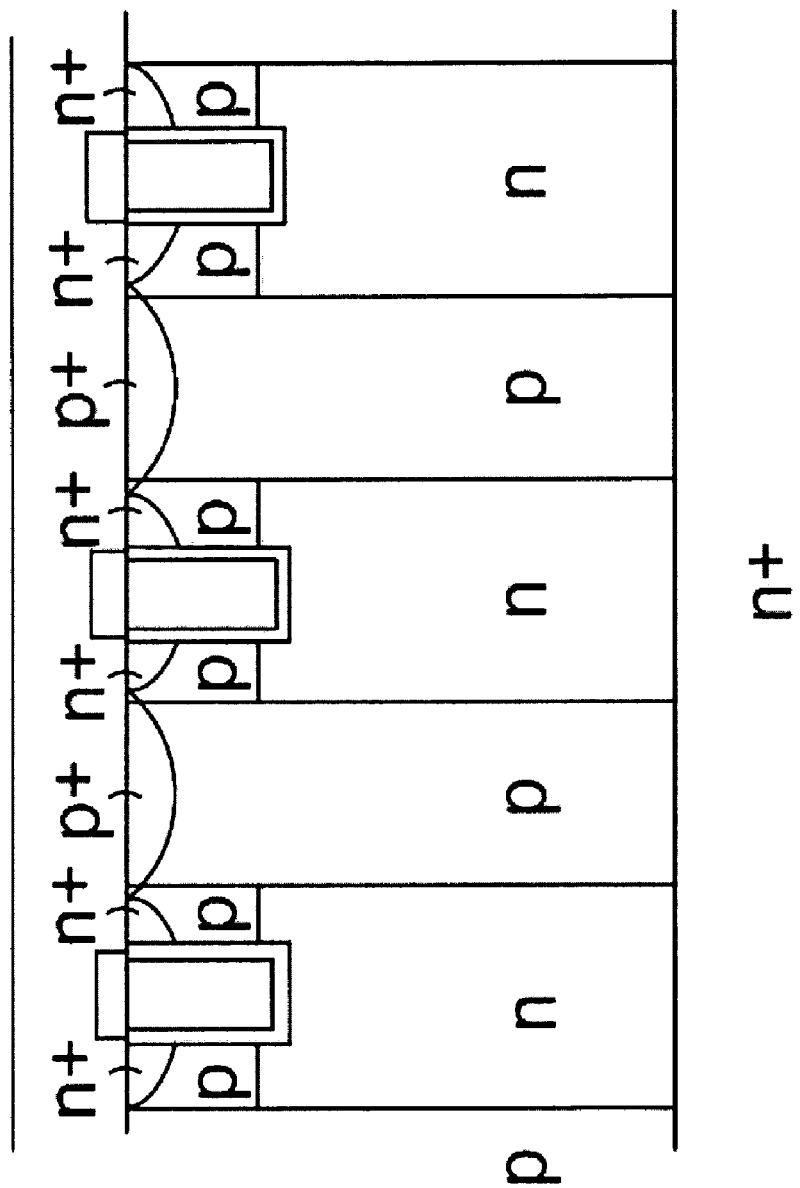

SUPER-JUNCTION TRENCH MOSFET WITH RESURF STEP OXIDE AND THE METHOD TO MAKE THE SAME

FIELD OF THE INVENTION

This invention relates generally to the cell structure, device configuration and fabrication process of power semiconductor devices. More particularly, this invention relates to a novel and improved cell structure, device configuration and improved process of a super-junction MOSFET.

BACKGROUND OF THE INVENTION

Compared to convention trench MOSFET, conventional super-junction trench MOSFET is more attractive due to its higher breakdown voltage and lower specific Rds (drain-source resistance). As is known to all, super-junction trench MOSFET is implemented with p type column structure and n type column structure arranged in parallel and connecting to each other on a heavily doped substrate, however, the manufacturing yield is not stable because it is very sensitive to fabrication process and conditions such as: the p type column structure and n type column structure dopant re-diffusion induced by subsequent thermal processes, trapped charges within the column, etc. . . . . All that will cause a hazardous condition of charge imbalance to the super-junction trench MOSFET. More specifically, these undesired influences become more pronounced at narrower column width for lower voltage ranging under 200V.

U.S. Pat. No. 7,601,597 disclosed a method to avoid the aforementioned p type column structure and n type column structure dopant re-diffusion issue by setting up p type column formation process at last step after all diffusion processes such as: sacrificial oxidation after trench etch, gate oxidation, p body formation and n+ source formation, etc. . . . have been done. The fabricated super-junction trench MOSFET is shown in FIG. 1A.

However, the disclosed process is not cost effective because that, first, the p type column structure is formed by growing additional p type epitaxial layer after deep trench etch; second, additional CMP (Chemical Mechanical Polishing) is required for surface planarization after the p type epitaxial layer is grown; third, double trench etches are necessary (one for shallow trench for trenched gate formation and another for deep trench for p type column structure formation), all the increased cost is not conductive to mass production. Moreover, other factors such as: trapped charges within the column structure causing charge imbalance is still not resolved.

Prior arts (paper "Industrialization of Resurf Stepped Oxide Technology for Power Transistors", by M. A. Gajda, etc. and paper "Tunable Oxide-Bypassed Trench Gate MOSFET Breaking the Ideal Super-junction MOSFET Performance Line at Equal Column Width", by Xin Yang, etc.) disclosed structures in order to resolve the limitation caused by super-junction trench MOSFET, as shown in FIG. 1B and FIG. 1C. Except for different technical names (structure in FIG. 1B named with RSO: Resurf Stepped Oxide and structure in FIG. 1C named with TOB: Tunable Oxide-Bypassed), both structures in FIG. 1B and FIG. 1C are basically same which can achieve lower specific Rds and higher breakdown voltage because the epitaxial layer has higher doping concentration than conventional MOSFET.

Refer to FIG. 1B and FIG. 1C again, both structures have deep trench with thick oxide along trench sidewalls and bottom into drift region. Only difference is that, while structure in FIG. 1B has single epitaxial layer while structure in FIG. 1C has double epitaxial layers (Epi 1 and Epi 2 as illustrated in FIG. 1C, Epi 1 supported on heavily doped substrate has lower doping concentration than Epi 2 near channel region). Due to the p type column structure and n type column structure interdiffusion, both structures in FIG. 1B and FIG. 1C do not have charge imbalance issue, resolving the technical limitation caused by super-junction trench MOSFET, however, the benefit of structures in FIG. 1B and FIG. 1C over super-junction trench MOSFET only pronounces at voltage ranging under 200V, which means, the conventional super-junction trench MOSFET has lower Rds when bias voltage is beyond 200V.

Therefore, there is still a need in the art of the semiconductor device fabrication, particularly for super-junction trench MOSFET design and fabrication, to provide a novel cell structure, device configuration and fabrication process that would resolve these difficulties and design limitations.

SUMMARY OF THE INVENTION

The present invention provides trench MOSFET by combining super-junction and RSO (Resurf Step Oxide) together to have additional freedom for better performance optimization and manufacturing capability by tuning thick oxide thickness to minimize influence of charge imbalance, trapped charges, etc. Moreover, a single deep trench and single epitaxial layer are only required to achieve better cost effective than the prior arts.

In one aspect, the invention features a super-junction trench MOSFET having split gates with buried source electrodes further includes: (a) a substrate of a first conductivity type; (b) an epitaxial layer of said first conductivity type grown on said substrate, said epitaxial layer has a lower doping concentration than said substrate; (c) a plurality of trenches starting from the upper surface of said epitaxial layer and down extending into said epitaxial layer; (d) a first insulation layer along the sidewalls and bottom of lower portion of each of said trenches; (e) a plurality of source electrodes formed by first doped polysilicon surrounded with said first insulation layer within lower portion of said trenches; (f) a second insulation layer along the sidewalls of upper portion of each of said trenches and above the top surface of said first insulation layer and said source electrode, said second insulation layer has a thinner thickness than said first insulation layer; (g) a plurality of gate electrodes formed by second doped polysilicon surrounded with said second insulation layer within upper portion of said trenches; (h) a plurality of first doped column regions of said first conductivity type with column shape within said epitaxial layer, each of said first doped column regions formed adjacent to the sidewalls of said trenches and having column bottom above trench bottom of said trench; (i) a plurality second doped column regions of a second conductivity type with column shape within said epitaxial layer, each of said second doped region formed between two adjacent said first doped column regions; (j) a plurality of body regions of said second conductivity type within said epitaxial layer, each of said body region formed adjacent to the sidewalls of said trenches and onto the top surface of said first doped column region and said second doped column regions; (k) a plurality of source regions of said first conductivity type near the top surface of said body region and adjacent to the sidewalls of said trenches, said source region has a higher doping concentration than said epitaxial layer; (l) a plurality of avalanche enhancement doped regions of said second conductivity type within said body regions below said source regions, each of said avalanche enhancement doped regions having a higher doping concentration than said body region; (m) a plurality of contact regions contacting to said source regions, and shallow contact doped regions of said second conductivity type near the top surface of said body regions, between a pair of said source regions and onto said avalanche enhancement doped regions, said shallow contact doped region has a higher doping concentration than said avalanche enhancement doped region; (n) a third insulation layer onto top surface of each of said gate electrode.

In another aspect, the invention features a super-junction trench MOSFET having single gates further includes: (a) a substrate of a first conductivity type; (b) an epitaxial layer of said first conductivity type grown on said substrate, said epitaxial layer has a lower doping concentration than said substrate; (c) a plurality of trenches starting from the upper surface of said epitaxial layer and down extending into said epitaxial layer; (d) a first insulation layer along the sidewalls of lower portion of each of said trenches; (e) a second insulation layer along the sidewalls of upper portion of each of said trenches, said second insulation layer has a thinner thickness than said first insulation layer; (f) a plurality of gate electrodes formed by doped polysilicon within said trenches and surrounded with said first insulation layer and said second insulation layer; (g) a plurality of first doped column regions of said first conductivity type with column shape within said epitaxial layer, each of said first doped column regions formed adjacent to the sidewalls of said trenches and having column bottom above trench bottom of said trench; (h) a plurality of second doped column regions of a second conductivity type with column shape within said epitaxial layer, each of said second doped column regions formed between two adjacent said first doped column region; (i) a plurality of body regions of said second conductivity type within said epitaxial layer, each of said body regions formed adjacent to the sidewalls of said trenches and onto the top surface of said first doped column region and said second doped column region; (j) a plurality of source regions of said first conductivity type near the top surface of said body regions and adjacent to the sidewalls of said trenches, said source regions have a higher doping concentration than said epitaxial layer; (k) a plurality of avalanche enhancement doped regions of said second conductivity type within said body regions below said source regions, each of said avalanche enhancement doped regions formed between a pair of said source regions and having a higher doping concentration than said body region; (l) a plurality of contact regions contacting to said source regions, and shallow contact doped regions of said second conductivity type near the top surface of said body regions, between a pair of said source regions and onto said avalanche enhancement doped regions, said shallow contact doped regions have a higher doping concentration than said avalanche enhancement doped regions; (m) a third insulation layer onto top surface of each of said gate electrodes and termination area.

Preferred embodiments include one or more of the following features. Each of said trenches further extends into said substrate. The super-junction trench MOSFET further comprises Guard Ring as termination area when breakdown voltage is less than or equal to 100V. The super-junction trench MOSFET further comprises Guard Ring and multiple floating rings as termination area when breakdown voltage is larger than 100V. The super-junction trench MOSFET further comprises source metal onto said third insulation layer and extend into contact regions between every two adjacent third insulation layer to contact with said shallow contact doped regions and said source regions in active area under source metal or only shallow contact doped regions near termination area.

The invention also features a method of making a super-junction trench MOSFET having split gates with buried source electrodes, including: (a) growing an epitaxial layer of a first conductivity type upon a heavily doped substrate of said first conductivity type; (b) forming an oxide layer onto said epitaxial layer; (c) applying a trench mask onto said oxide layer and forming a plurality of trenches by etching through said oxide layer and into said epitaxial layer; alternatively etching through said epitaxial layer and further into said substrate by successively dry oxide etch and dry silicon etch; (d) removing said trench mask and growing a sacrificial oxide layer onto inner surface of said trenches and removing said sacrificial oxide to remove the plasma damage; (e) growing a screen oxide along the inner surface of said trenches; (f) carrying out angle Ion Implantation of second conductivity type dopant and diffusion to form the second conductivity doped regions between two adjacent sidewalls of said trenches; (g) carrying out angle Ion Implantation of first conductivity type dopant and diffusion to form the first conductivity doped regions adjacent to the sidewalls of said trenches and in parallel surrounding said second conductivity doped regions; (h) forming a first insulation layer along the inner surface of said trenches by thermal oxide growth or oxide deposition; (i) depositing first doped polysilicon filling said trenches surrounded with said first insulation layer serving as source electrodes; (j) etching back said source electrodes and said first insulation layer from the upper portion of said trenches and etching said oxide layer from the top surface of said epitaxial layer; (k) growing a second insulation layer along the upper sidewalls of each of said trenches and onto the top surface of said source electrodes and said first insulation layer, said second insulation layer has a thinner thickness than said first insulation layer; (l) depositing second doped polysilicon filling the upper portion of said trenches and close to said second insulation layer to serving as gate electrodes; (m) etching back said gate electrodes by CMP (Chemical Mechanical Polishing) or Plasma Etch; (n) applying a body mask onto top surface of said epitaxial layer; (o) carrying out Ion Implantation of second conductivity type dopant and diffusion to form body regions; (p) removing said body mask and applying a source mask onto top surface of said epitaxial layer; (q) carrying out Ion Implantation of first conductivity type dopant and diffusion to form source regions; (r) removing said source mask and depositing a third insulation layer onto top surface of said epitaxial layer; (s) applying a contact mask onto top surface of said third insulation layer and etching contact holes by dry oxide etch to form contact regions; (t) carrying out high energy Ion Implantation of second conductivity type dopant to form the avalanche enhancement doped regions; (u) carrying out blank Ion Implantation of second conductivity type dopant to form the shallow contact doped regions.

Preferred embodiments include one or more of the following features. The method further comprises applying Guard Ring mask and carrying out Ion Implantation of second conductivity type dopant and diffusion to form Guard Ring before applying the body mask. The method further comprises depositing metal layer onto top surface of third insulation layer and applying metal mask continued by etching metal layer to form source metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 1A is a cross-sectional view of a super-junction trench MOSFET of prior art.

DETAILED DESCRIPTION OF THE EMBODIMENTS

Figure 1B:
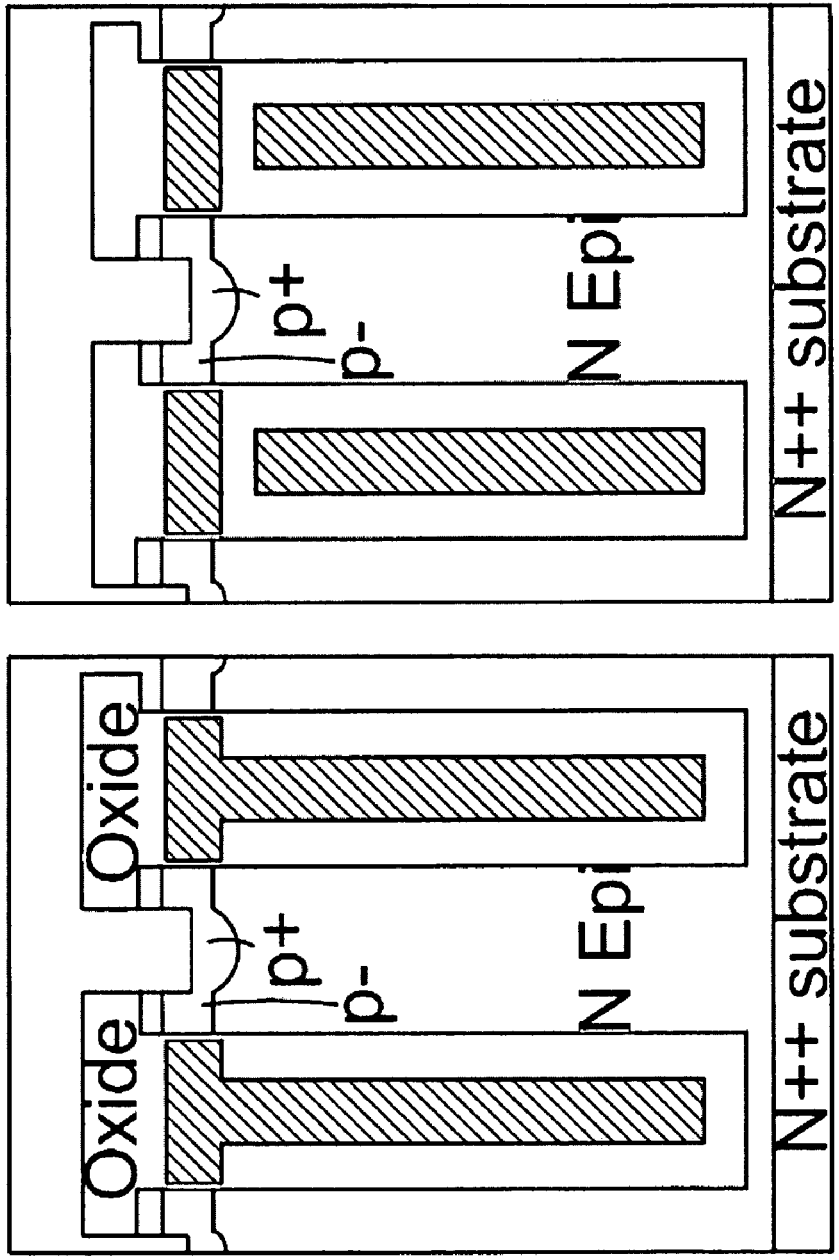
FIG. 1B is a cross-sectional view of a trench MOSFET of another prior art.
Figure 1C:
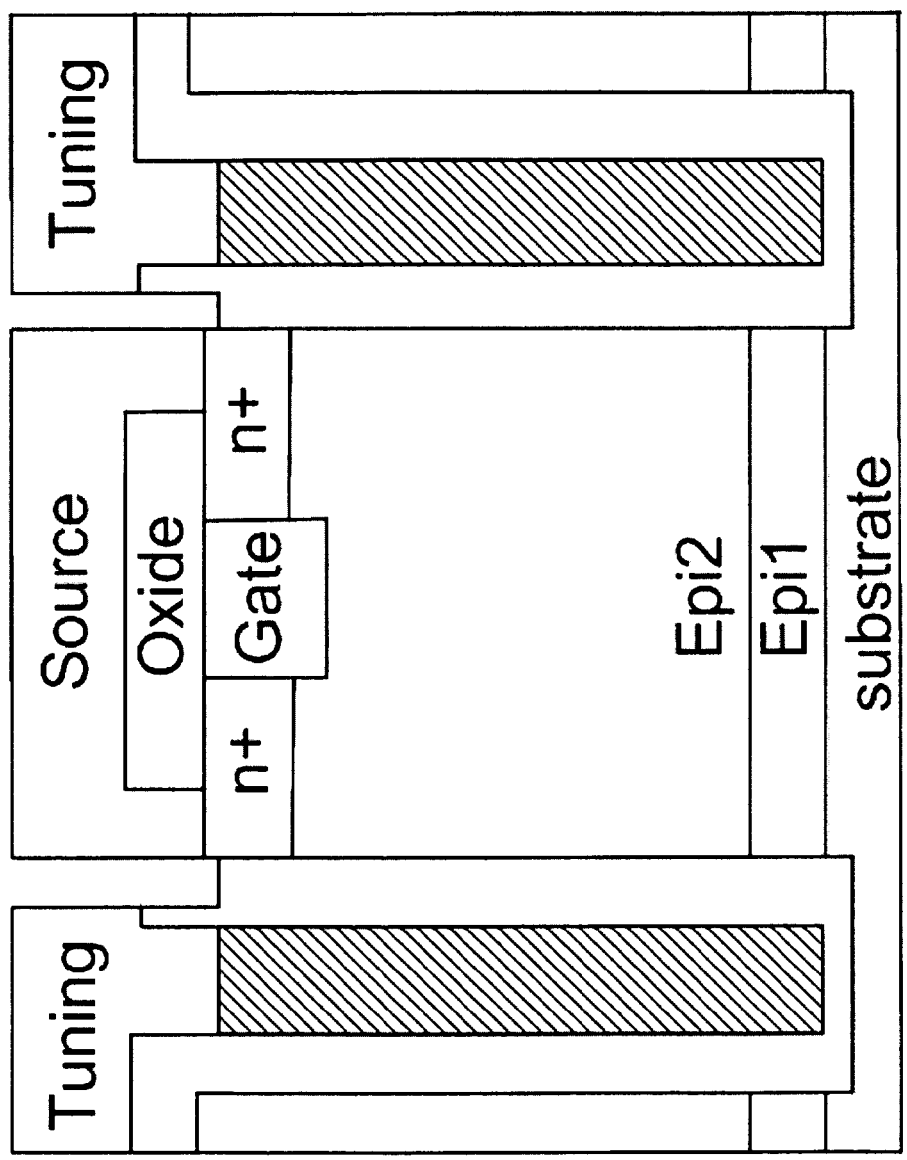
FIG. 1C is a cross-sectional view of a trench MOSFET of another prior art.
Figure 2A:
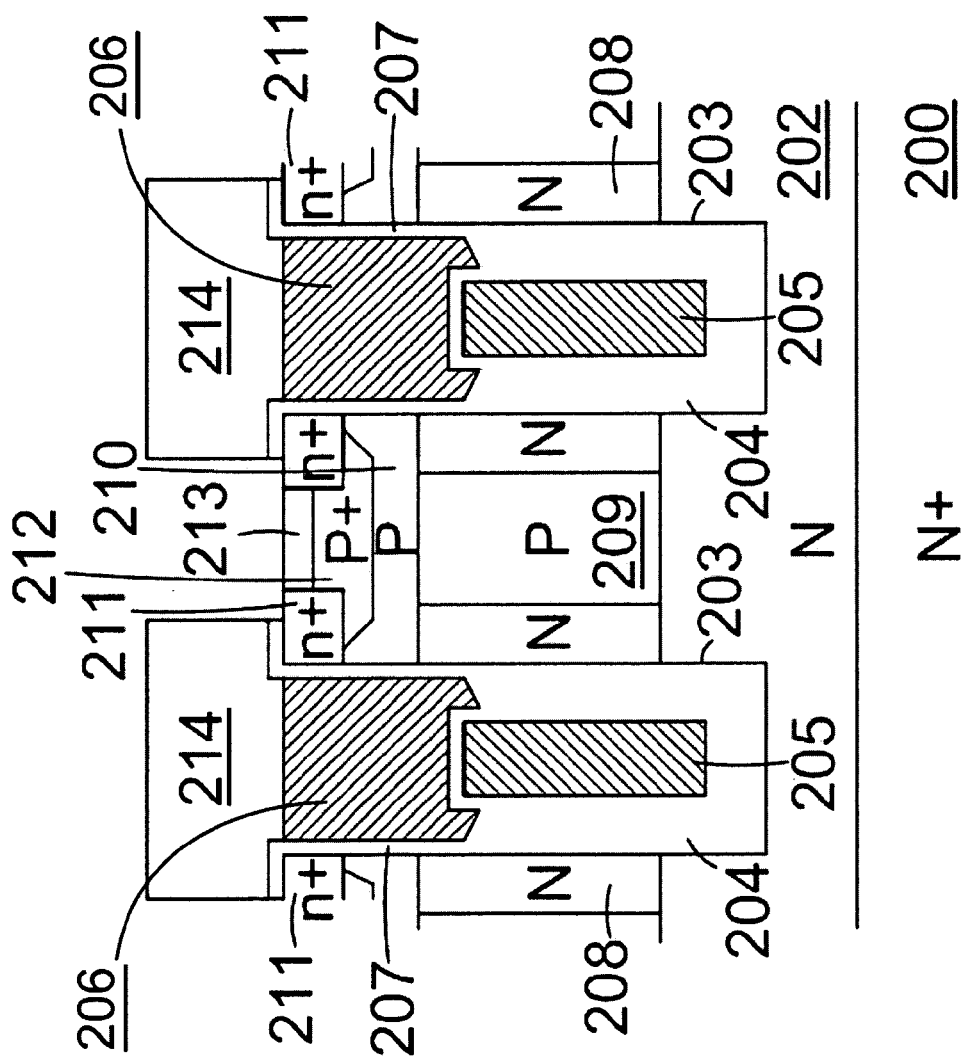
FIG. 2A is a cross-sectional view of a preferred embodiment according to the present invention.

Please refer to FIG. 2A for a preferred embodiment of this invention where an N-channel super-junction trench MOSFET is formed on an N+ substrate 200 onto which grown an N epitaxial layer 202. A plurality of trenches 203 are formed starting form the upper surface of said epitaxial layer 202 and vertically down extending, not reaching the interface of said substrate 200 and said epitaxial layer 202. Into said trenches 203, doped poly is deposited filling the lower portion of said trenches 203 serving as source electrodes 205 padded by a first insulation layer 204. Into the upper portion of said trenches 203, another doped poly is deposited to serving as gate electrodes 206 onto said source electrodes 205 padded by a second insulation layer 207 having a thinner thickness than said first insulation layer 204. Adjacent to the sidewalls of said trenches 203, N doped region 208 with column shape is formed within said epitaxial layer 202 and in parallel to P doped region 209 with column shape. Onto the top surface of said N doped region 208 and P doped region 209, P body region 210 is formed between a pair of said trenches 203 with n+ source regions 211 near its top surface. Between a pair of said source regions 211, P+ avalanche enhancement doped region 212 is formed with P++ shallow contact doped region 213 near its top surface. Onto the top surface of said gate electrodes 206, a third insulation layer 214 is formed to isolate said gate electrodes from the source metal.

Figure 2B:
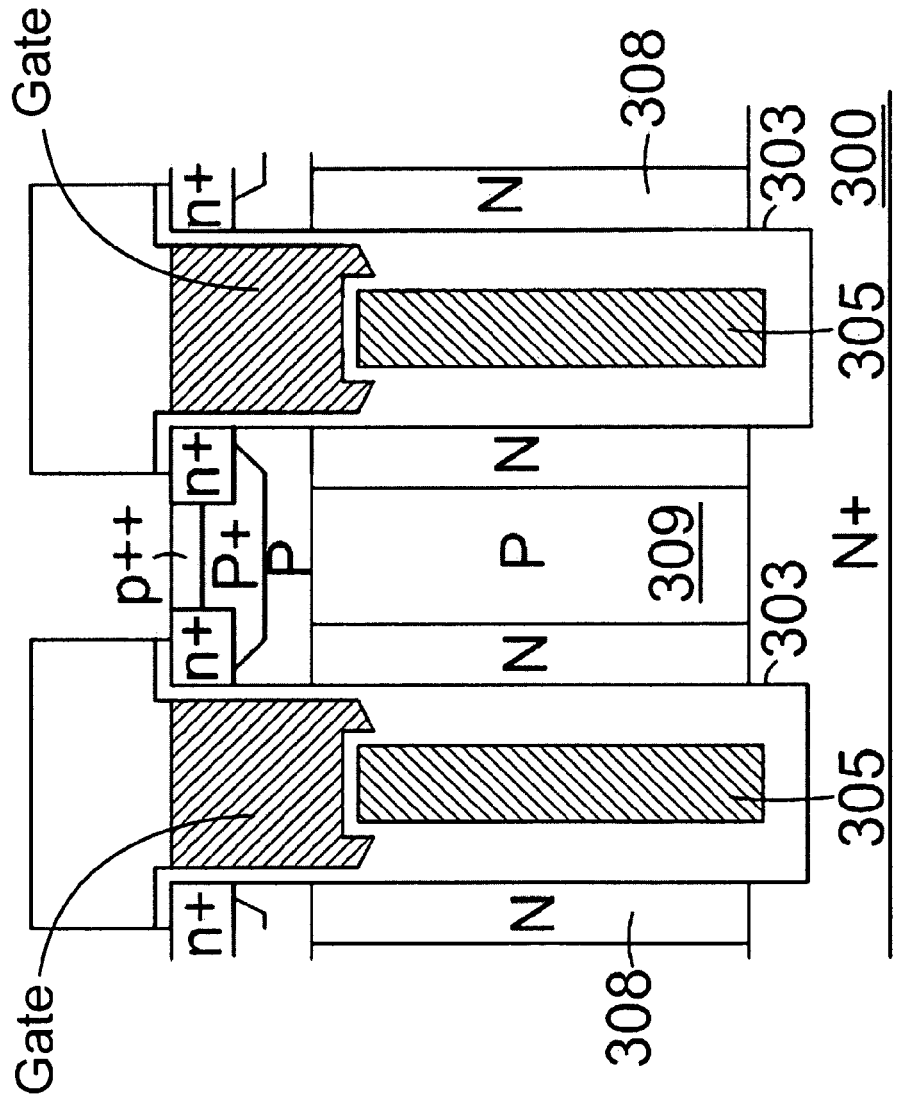
FIG. 2B is a cross-sectional view of another preferred embodiment according to the present invention.

FIG. 2B shows another preferred embodiment of the present invention, where the disclosed super-junction trench MOSFET is similar to structure in FIG. 2A except that, a plurality of trenches 303 are extending from the top surface of said epitaxial layer and vertically down into the substrate 300, the buried source electrodes 305 are also extending into substrate 300. Besides, the N doped region 308 and P doped region 309 is reaching the interface of the epitaxial layer and the substrate 300.

Figure 2C:
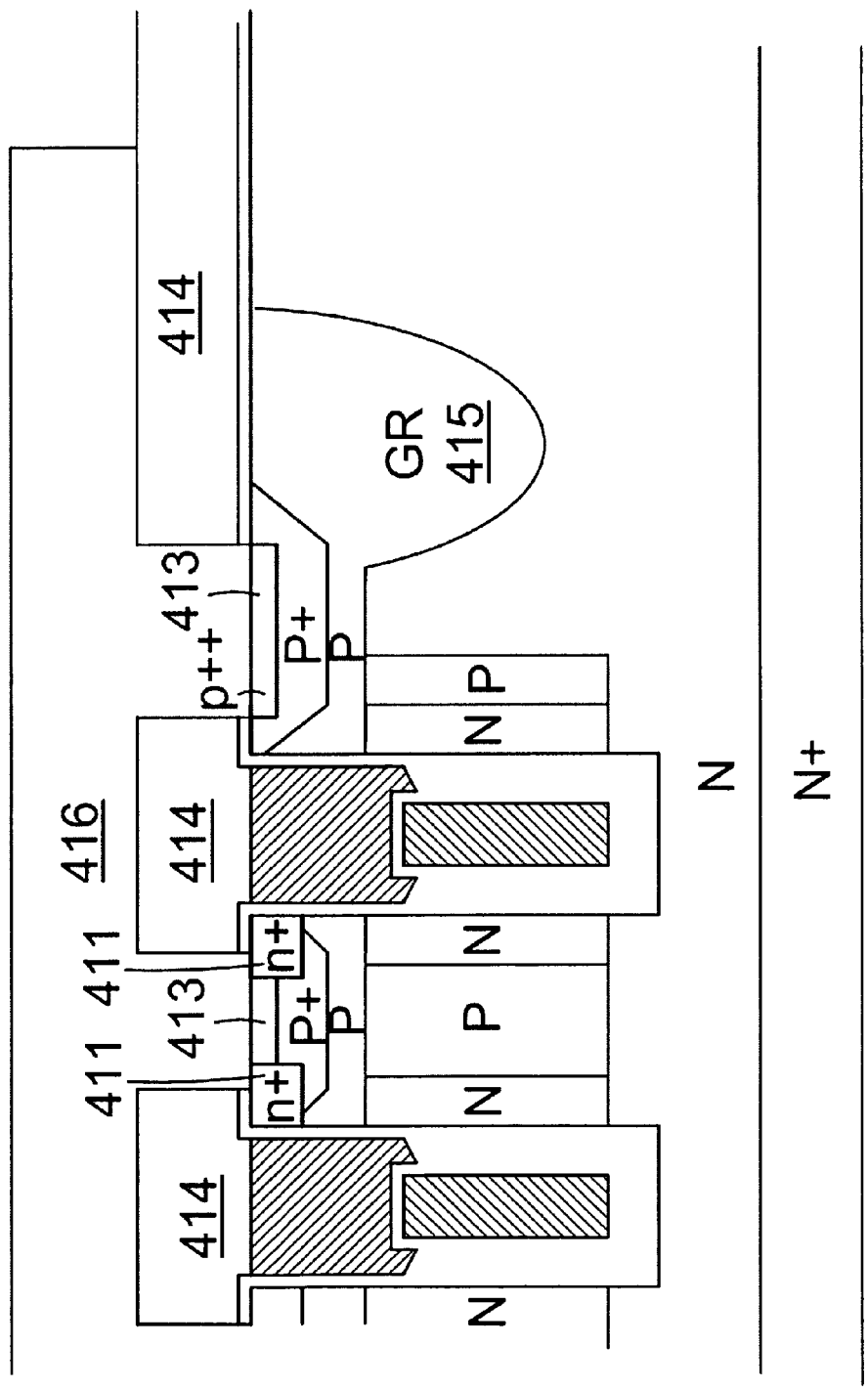
FIG. 2C is a cross-sectional view of another preferred embodiment according to the present invention.

FIG. 2C shows another preferred embodiment of the present invention, where the disclosed super-junction trench MOSFET is similar to structure in FIG. 2A except comprising Guard Ring 415 in termination area. Besides, source metal 416 is formed onto the third insulation layer 414 and extending into the contact regions between every two adjacent third insulation layer 414 to contact with the shallow contact doped regions 413 and the source regions 411 in active area or only contact with shallow contact doped regions 413 near termination area.

Figure 2D:
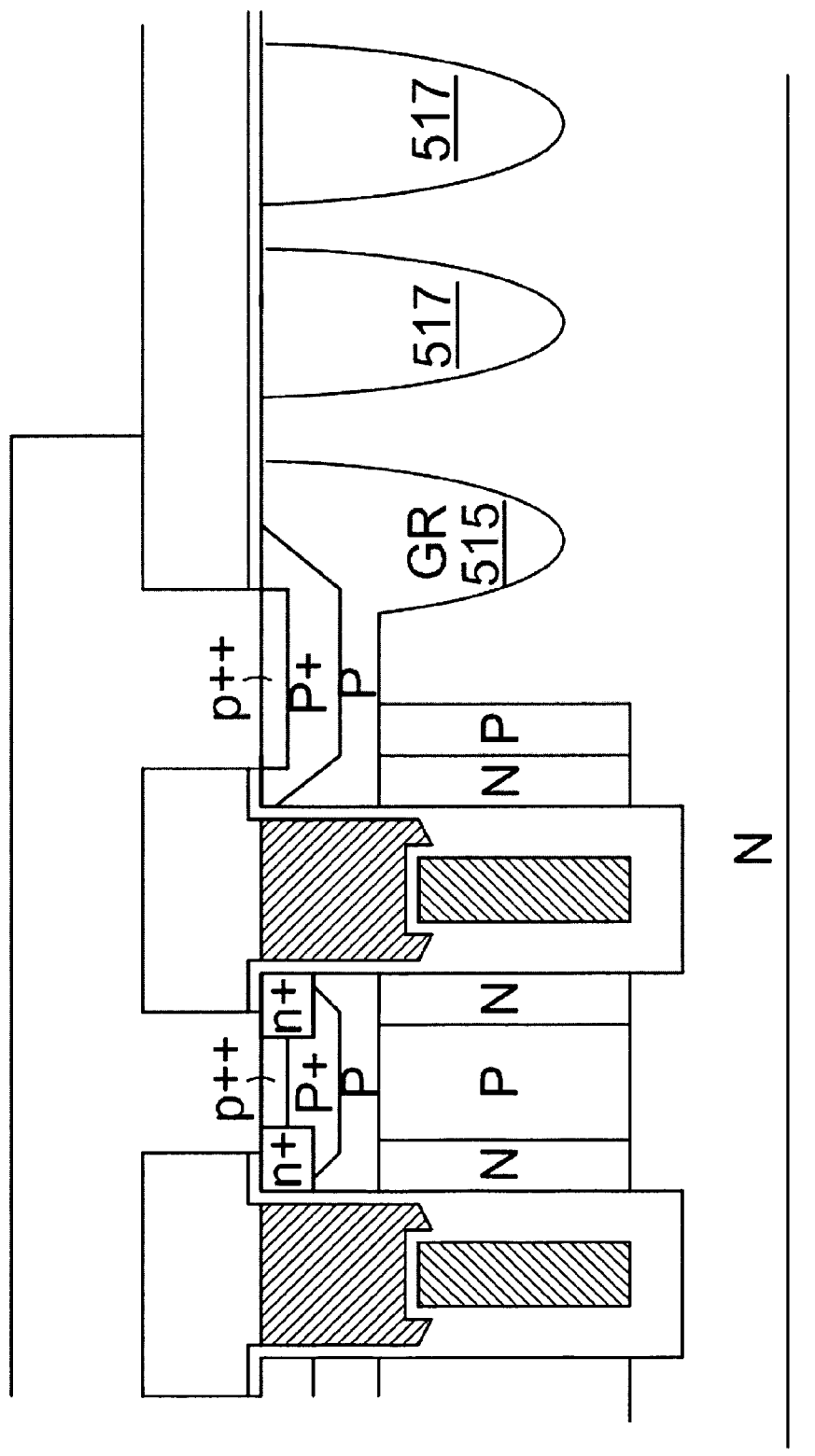
FIG. 2D is a cross-sectional view of another preferred embodiment according to the present invention.

FIG. 2D shows another preferred embodiment of the present invention, where the disclosed super-junction trench MOSFET is similar to structure is FIG. 2C except comprising Guard Ring 515 and multiple floating rings 517 as termination area.

Figure 2E:
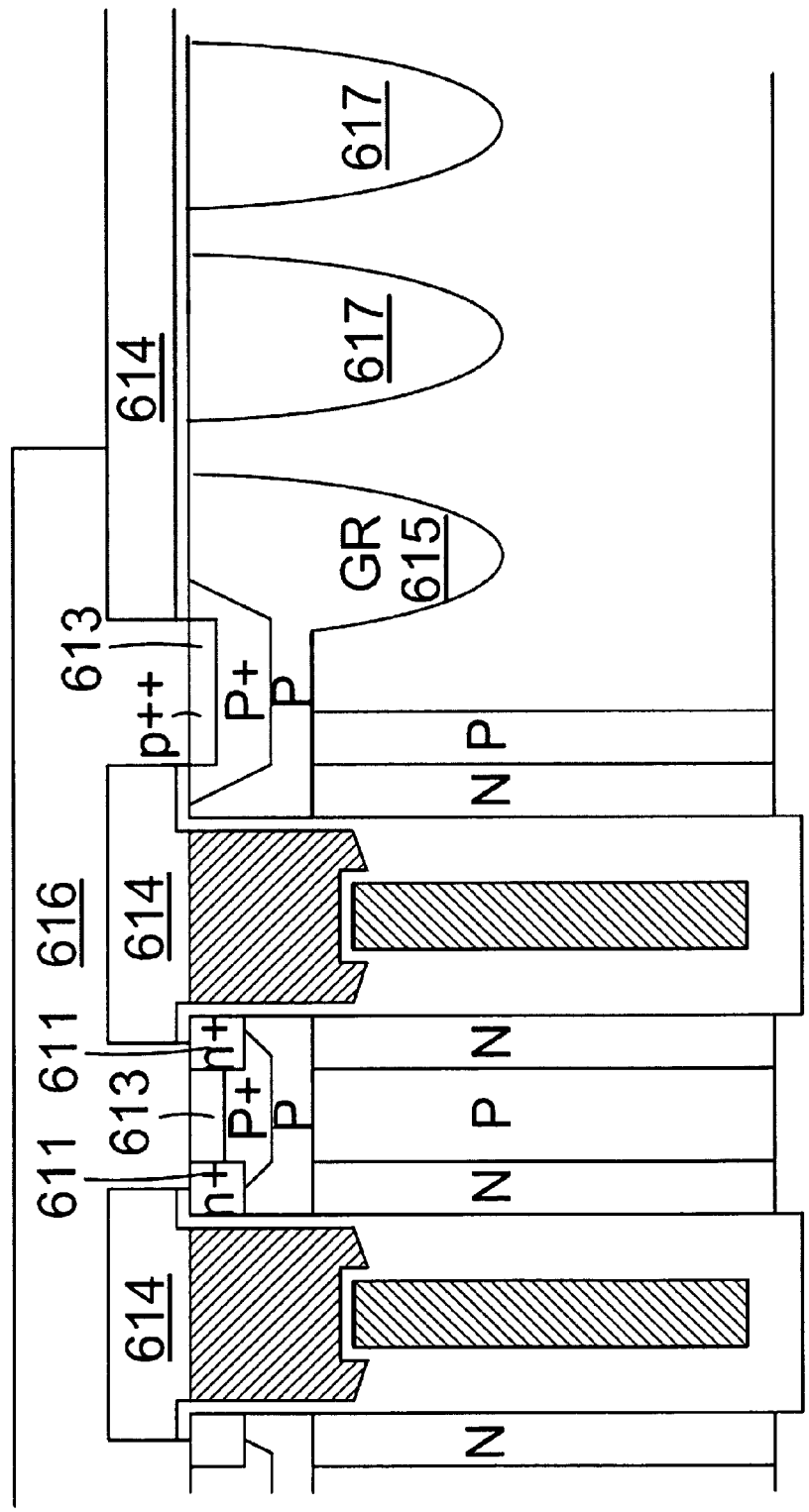
FIG. 2E is a cross-sectional view of another preferred embodiment according to the present invention.

FIG. 2E shows another preferred embodiment of the present invention, where the disclosed super-junction trench MOSFET is similar to structure in FIG. 2B except comprising Guard Ring 615 and multiple floating rings 617 as termination area. Besides, source metal 616 is formed onto the third insulation layer 614 and extending into the contact regions between every two adjacent third insulation layer 614 to contact with the shallow contact doped regions 613 and the source regions 611 in active area or only contact with shallow contact doped regions 613 near termination area.

Figure 3A:
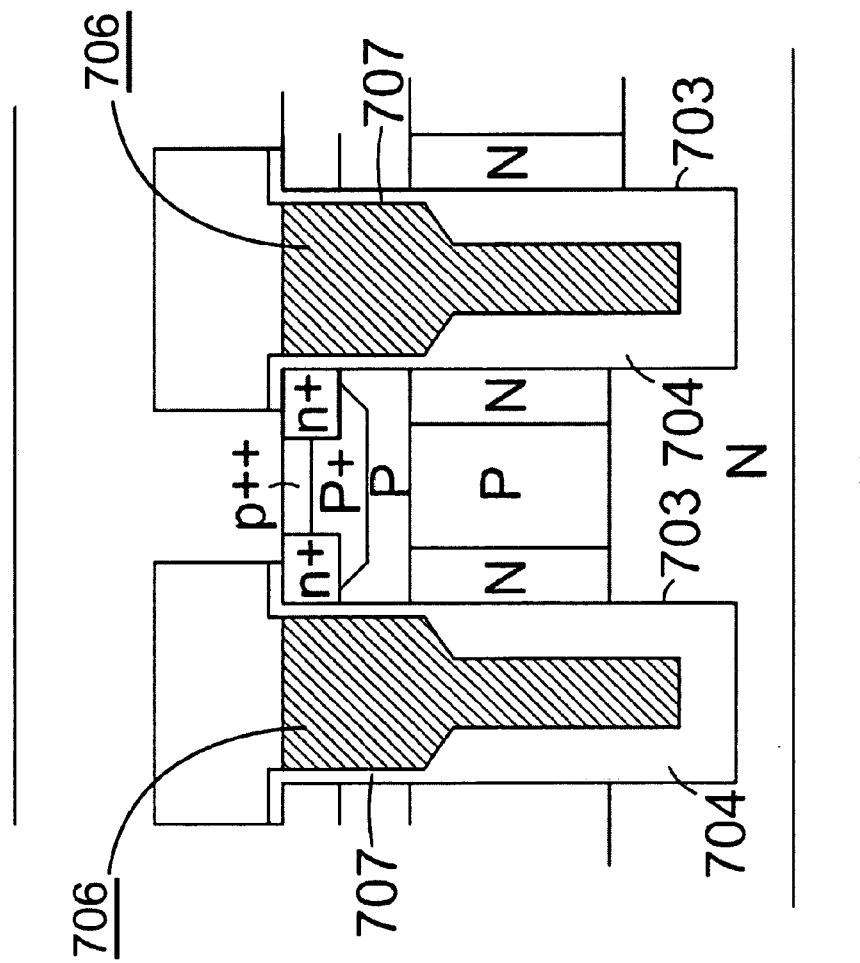
FIG. 3A is a cross-sectional view of another preferred embodiment according to the present invention.

FIG. 3A shows another preferred embodiment of the present invention, where the disclosed super-junction trench MOSFET is similar to structure in FIG. 2A except no source electrodes but single gates 706 in a plurality of trenches 703. Each of said single gates 706 is padded by first insulation layer 704 in lower portion of said trenches 703 and padded by second insulation layer 707 in upper portion of said trenches 703. Furthermore, said first insulation layer 704 has a thicker thickness than said second insulation layer 707.

Figure 3B:
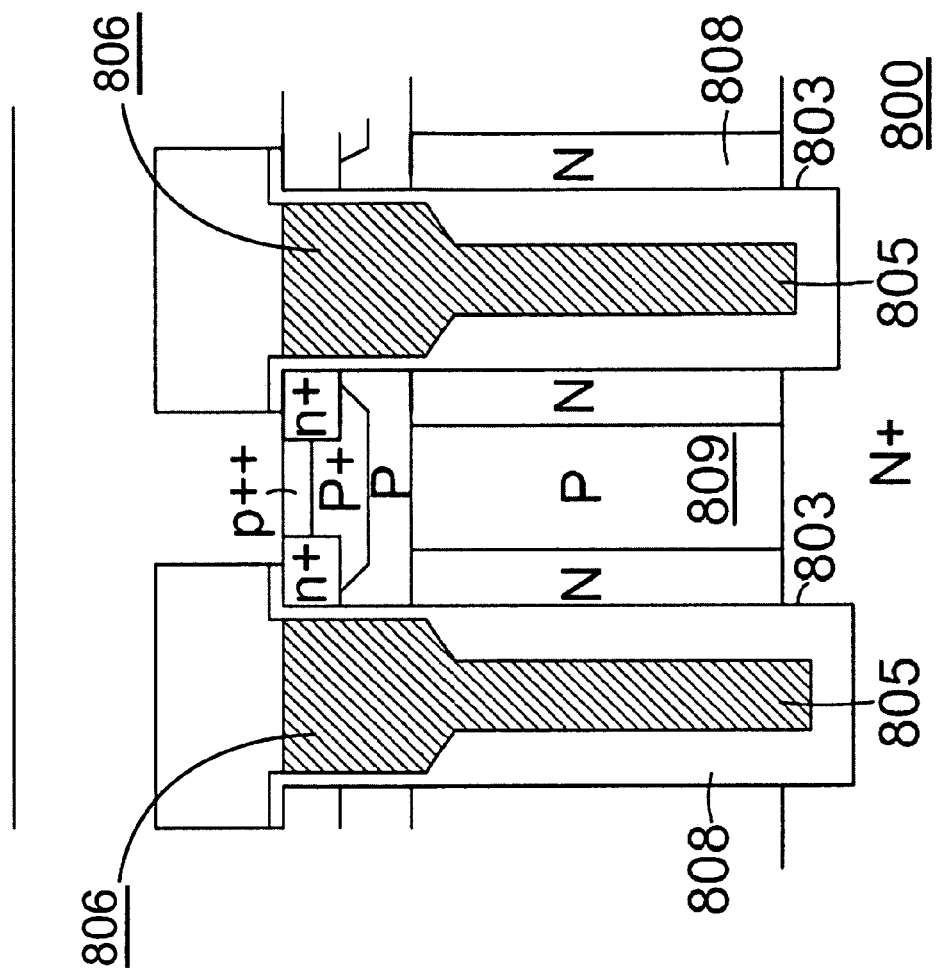
FIG. 3B is a cross-sectional view of another preferred embodiment according to the present invention.

FIG. 3B shows another preferred embodiment of the present invention, where the disclosed super-junction trench MOSFET is similar to structure in FIG. 3A except that, a plurality of trenches 803 are extending from the top surface of said epitaxial layer and vertically down into the substrate 800, the single gate electrodes 806 are also extending into substrate 800. Besides, the N doped region 808 and P doped region 809 is reaching the interface of the epitaxial layer and the substrate 800.

Figure 4A:
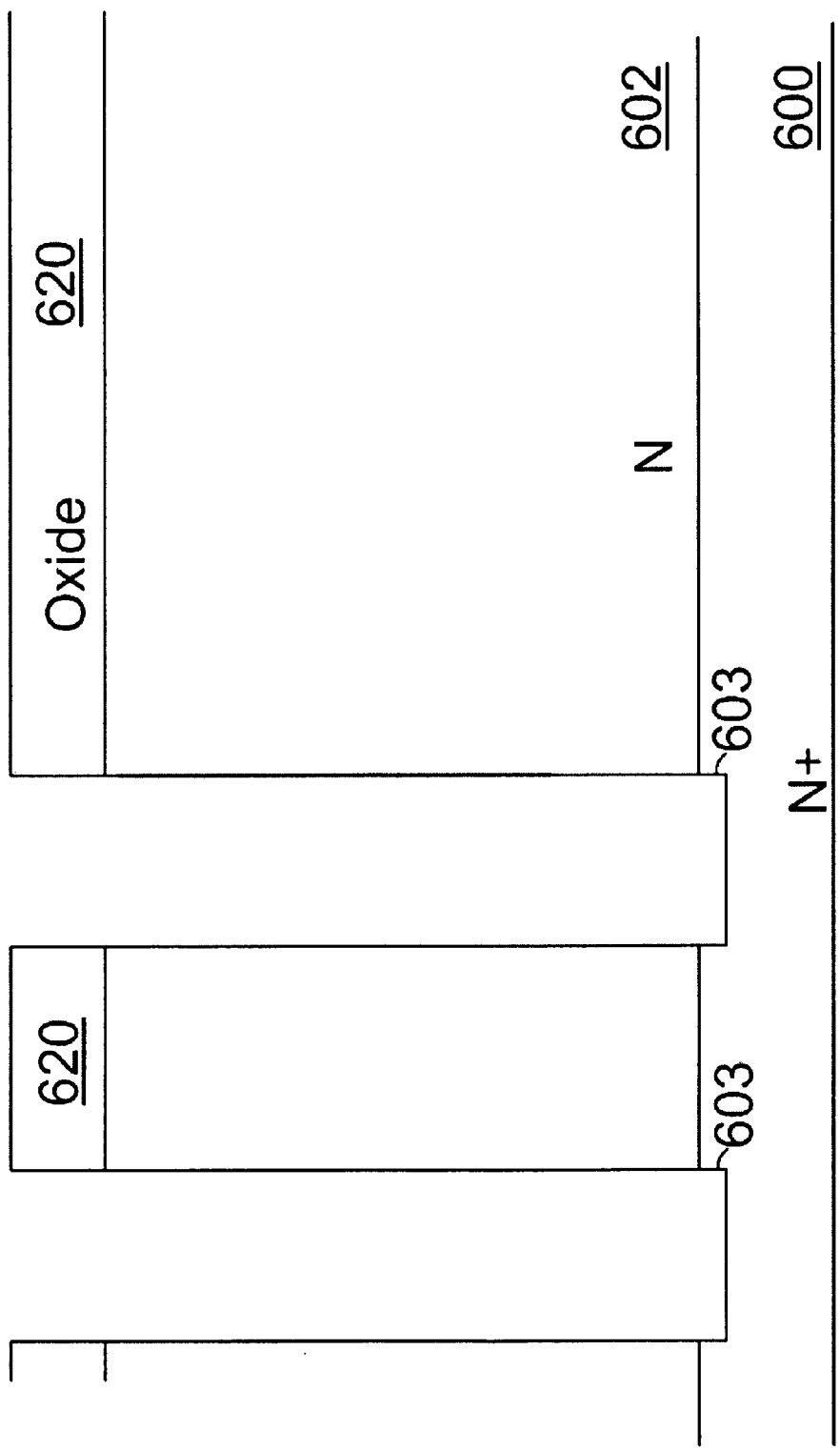
FIGS. 4A~4G are a serial of side cross-sectional views for showing the processing steps for fabricating the super-junction trench MOSFET as shown in FIG. 2E.

FIG. 4A to 4G is a series of exemplary steps that are performed to form the inventive super-junction trench MOSFET in FIG. 2E. In FIG. 4A, an N doped epitaxial layer 602 is grown on an N+ doped substrate 600. Next, an oxide layer 620 is formed onto the top surface of said epitaxial layer 602. Then, after a trench mask (not shown) is applied onto oxide 620, a plurality of trenches 603 are etched penetrating through said oxide 620, said epitaxial layer 602 and extending into said substrate 600 by successively dry oxide etch and dry silicon etch.

Figure 4B:
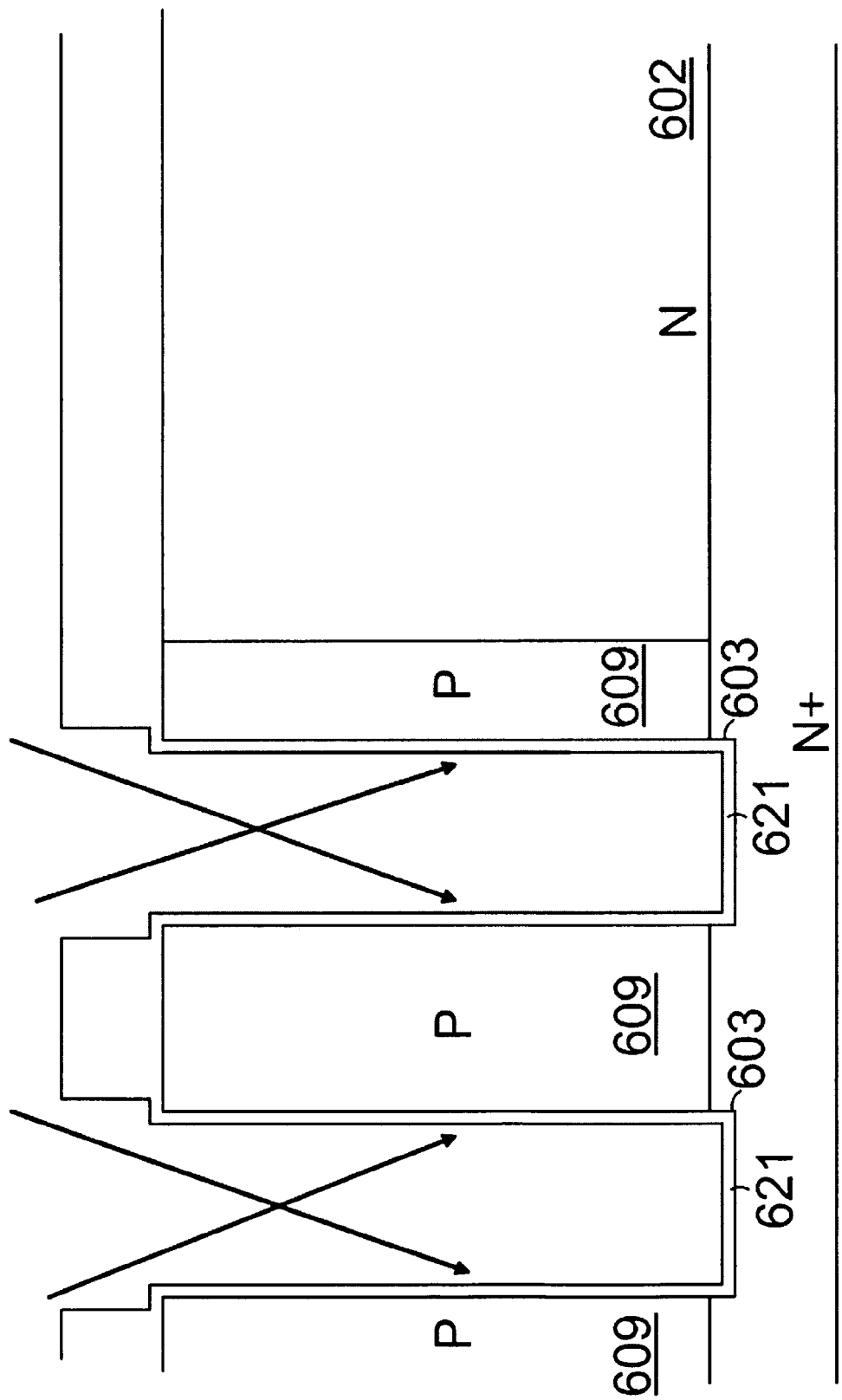

In FIG. 4B, a sacrificial oxide (not shown) is first grown and then removed to eliminate the plasma damage introduced during opening said trenches 603. After that, a screen oxide 621 is grown along the inner surface of said trenches 603. Then, angle Ion Implantation of Boron dopant is carried out to form P doped regions 609 with column shape adjacent to the sidewalls of said trenches 603 within said epitaxial layer 602.

Figure 4C:
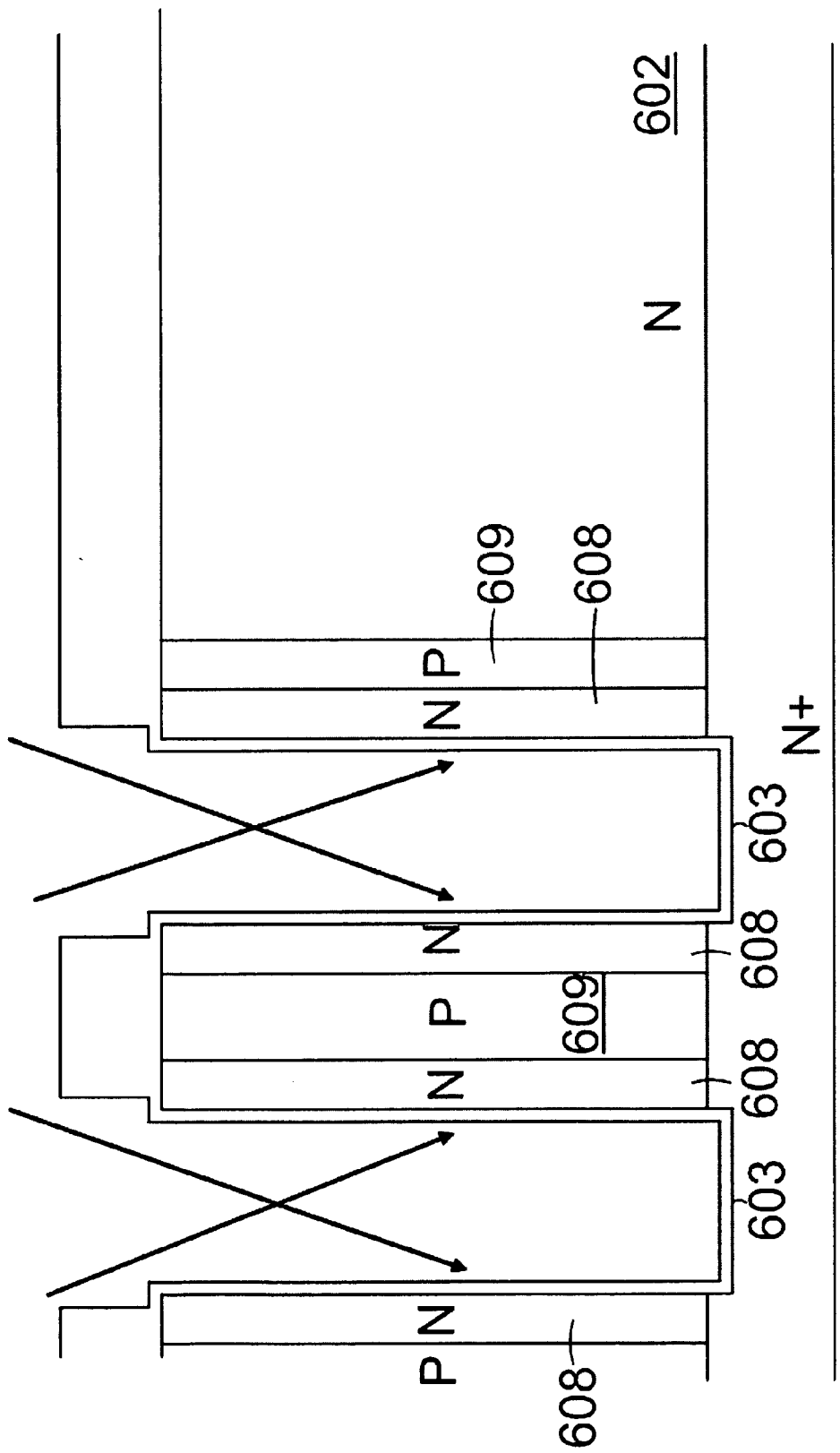

In FIG. 4C, another angle Ion Implantation of Arsenic or Phosphorus dopant is carried out to form N doped region 608 with column shape adjacent to the sidewalls of said trenches 603 and in parallel with said P doped regions 609.

Figure 4D:
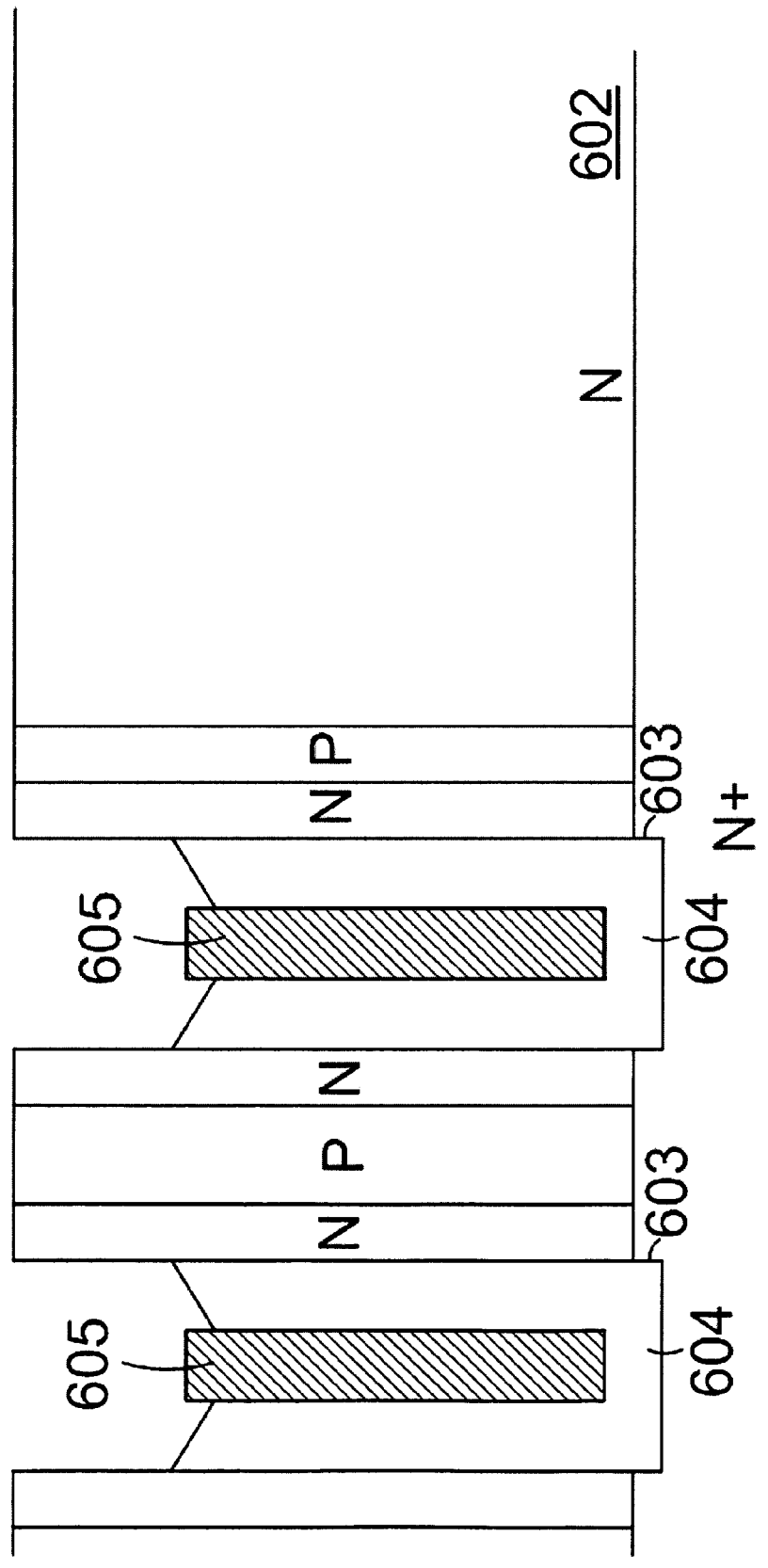

In FIG. 4D, a first insulation layer 604 is formed lining the inner surface of said trenches 603 by thermal oxide growth or thick oxide deposition. Then, doped poly is deposited onto said first insulation layer 604 to filling said trenches 603 serving as source electrodes 605. Next, said source electrodes 605 and said first insulation layer 604 are etched back, leaving enough portions in lower portion of said trenches 603.

Figure 4E:
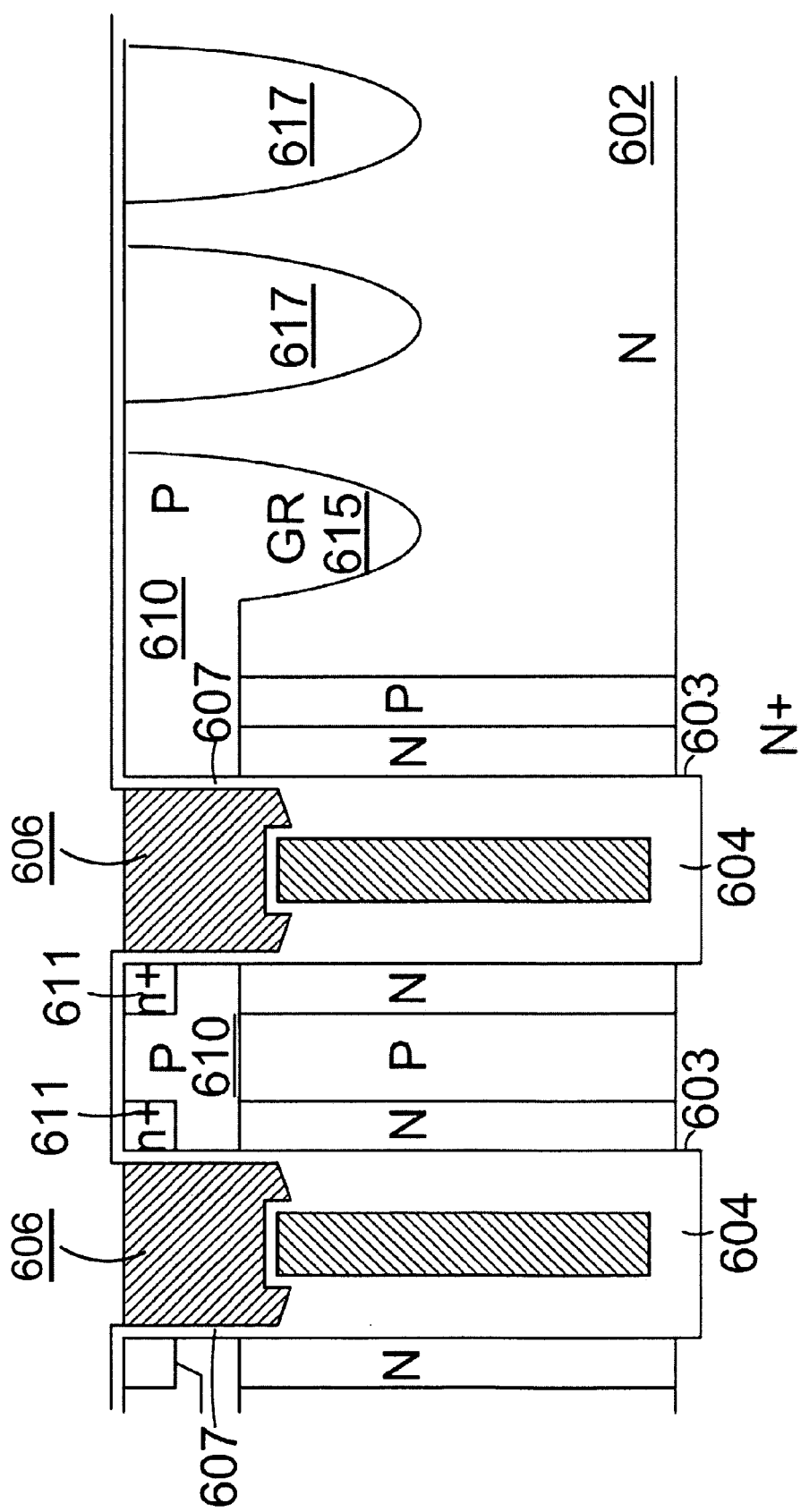

In FIG. 4E, a second insulation layer 607 is grown along the upper sidewalls of said trenches 603 and the top surface of said source electrodes, and said second insulation layer 607 has a thinner thickness than said first insulation layer 604. Then, doped poly is deposited onto said second insulation layer 607 to filling the upper portion of said trenches 603 serving as gate electrodes 606. Next, said gate electrodes 606 are etched back by CMP or Plasma Etch. After applying a Guard Ring mask (not shown) onto top surface of said epitaxial layer 602, Ion Implantation of P type dopant is carried out and followed by diffusion after removing said Guard Ring mask to form Guard Ring 616 and multiple floating rings 617. Then, after applying a body mask (not shown), Ion Implantation of P type dopant is carried out and followed by diffusion to form P body regions 610. Then, after removing said body mask and applying a source mask (not shown), Ion Implantation of N type dopant is carried out to form n+ source regions 611 near top surface of said P body regions 610, and said n+ source regions 611 have higher doping concentration than said epitaxial layer 602.

Figure 4F:
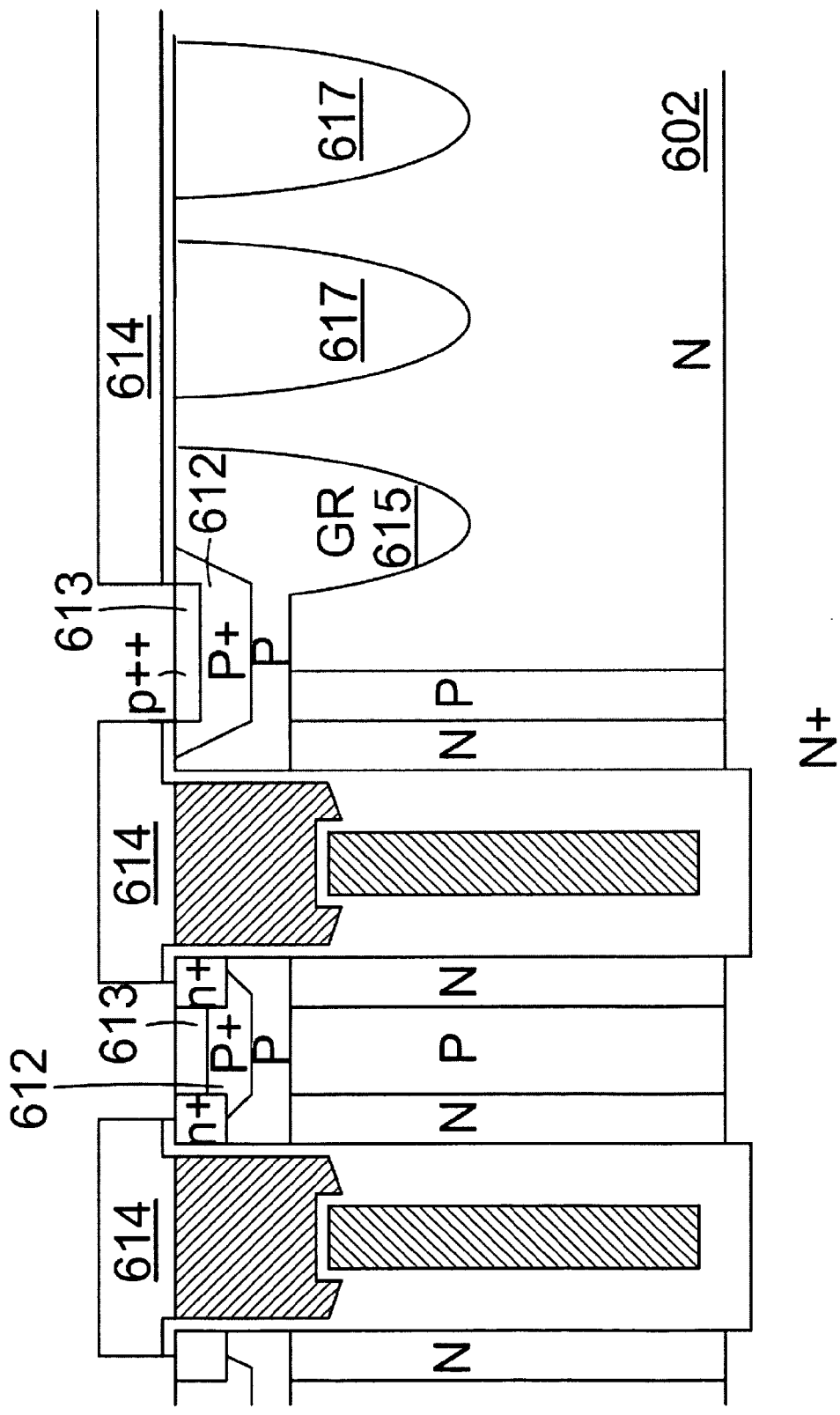

In FIG. 4F, an oxide layer is deposited onto top surface of said epitaxial layer 602 serving as third insulation layer 614. Then, after applying a contact mask (not shown) onto said third insulation layer 614, contact holes are formed by dry oxide etch. Next, high energy Ion Implantation of Boron dopant is carried out to form P+avalanche enhancement doped regions 612, and continued by Ion Implantation of BF2 to form P++shallow contact doped regions 613 above said avalanche enhancement doped regions 612.

Figure 4G:
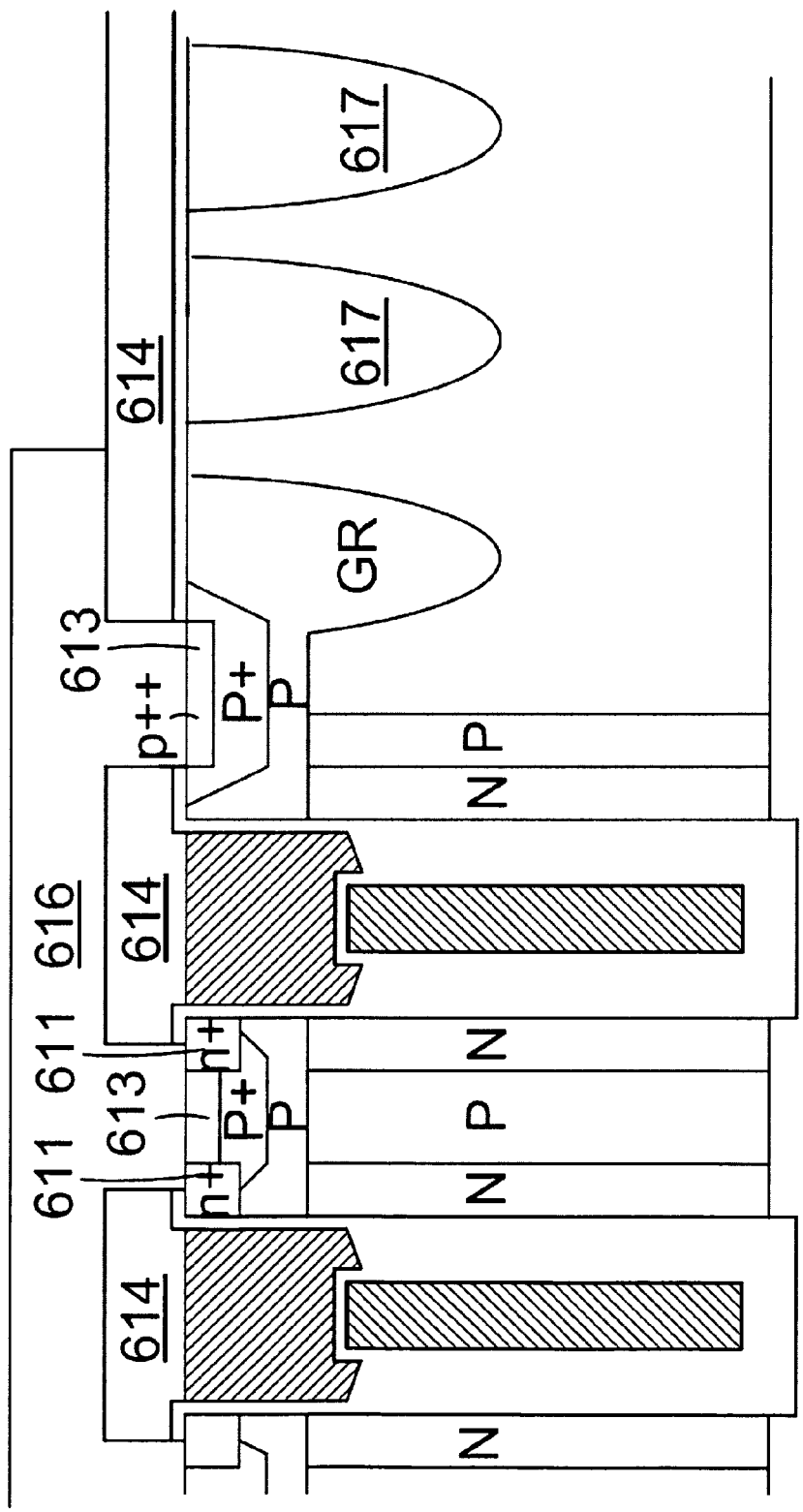

In FIG. 4G, a metal layer 616 is deposited onto top surface of said third insulation layer 614 and extending into the contact holes. Then, After applying a source mask (not shown), said metal layer 616 is etched to function as source metal to contact with said source regions 611 and said shallow contact doped regions 613.

Although the present invention has been described in terms of the presently preferred embodiments, it is to be understood that such disclosure is not to be interpreted as limiting. Various alternations and modifications will not doubt become apparent to those skilled in the art reading the above disclosure. Accordingly, it is intended that the appended claims be interpreted as covering all alternations and modifications as fall within the true spirit and scope of the invention.

What is claimed is:

1. A super-junction trench MOSFET with resurf stepped oxide, comprising:
   a substrate of a first conductivity type;
   an epitaxial layer of said first conductivity type grown on said substrate, said epitaxial layer having a lower doping concentration than said substrate;
   a plurality of trenches starting from the upper surface of said epitaxial layer and down extending into said epitaxial layer;
   a first insulation layer along the inner surface of lower portion of each of said trenches;
   a plurality of source electrodes within lower portion of said trenches and surrounded with said first insulation layer;
   a second insulation layer along the inner surface of upper portion of each of said trenches and along the top surface of said first insulation layer and said source electrodes, said second insulation layer has a thinner thickness than said first insulation layer;
   a plurality of gate electrodes within upper portion of said trenches and surrounded with said second insulation layer;
   a plurality of first doped column regions of said first conductivity type with column shape within said epitaxial layer, each of said first doped column regions formed adjacent to the sidewalls of said trenches and having column bottom above trench bottom of said trenches;
   a plurality of second doped column regions of a second conductivity type with column shape within said epitaxial layer, each of said second doped column regions formed in parallel surrounded with said first doped column regions;
   a plurality of body regions of said second conductivity type within said epitaxial layer, each of said body regions formed adjacent to the upper sidewalls of said trenches and onto the top surface of said first doped column regions and said second doped column regions; and
   a plurality of source regions of said first conductivity type near the top surface of said body region and adjacent to the upper sidewalls of said trenches, said source region has a higher doping concentration than said epitaxial layer.

2. The MOSFET of claim 1, wherein said trench bottom of said trenches is above said substrate.

3. The MOSFET of claim 1, wherein each of said trenches further extends into said substrate.

4. The MOSFET of claim 1 further comprises a plurality of avalanche enhancement doped regions of said second conductivity type within said body regions and below said source regions, each of said avalanche enhancement doped regions formed between a pair of said source regions and having a higher doping concentration than said body regions; and a plurality of shallow contact doped regions of said second conductivity type near the top surface of said body regions, each of said shallow contact doped regions formed between a pair of said source regions and onto said avalanche enhancement doped regions, said shallow contact doped regions having a higher doping concentration than said avalanche enhancement doped regions.

5. The MOSFET of claim 1 further comprises Guard Ring as termination area when breakdown voltage is less than or equal to 100V.

6. The MOSFET of claim 1 further comprises Guard Ring and multiple floating rings as termination area when breakdown voltage is larger than 100V.

7. The MOSFET of claim 1 further comprises source metal onto a third insulation layer and extend into contact regions between every two adjacent said third insulation layer to contact with said shallow contact doped regions and said source regions in active area or only shallow contact doped regions near by termination area.

8. A super-junction trench MOSFET with resurf stepped oxide, comprising:
   a substrate of a first conductivity type;
   an epitaxial layer of said first conductivity type grown on said substrate, said epitaxial layer having a lower doping concentration than said substrate;
   a plurality of trenches starting from the upper surface of said epitaxial layer and down extending into said epitaxial layer;

a first insulation layer along the inner surface of lower portion of each of said trenches;

a second insulation layer along the inner surface of upper portion of each of said trenches, said second insulation layer has a thinner thickness than said first insulation layer;

a plurality of gate electrodes within said trenches surrounded with said first insulation layer and said second insulation layer;

a plurality of first doped column regions of said first conductivity type within said epitaxial layer, each of said first doped regions column formed adjacent to the sidewalls of said trenches and having column bottom above trench bottom of said trenches;

a plurality of a second doped column regions of a second conductivity type within said epitaxial layer, each of said second doped column regions formed in parallel surrounded with said first doped column regions;

a plurality of body regions of said second conductivity type within said epitaxial layer, each of said body regions formed adjacent to the upper sidewalls of said trenches and onto the top surface of said first doped column regions and said second doped column regions; and a plurality of source regions of said first conductivity type near the top surface of said body regions and adjacent to the upper sidewalls of said trenches, said source regions have a higher doping concentration than said epitaxial layer.

9. The MOSFET of claim 8, wherein said trench bottom of said trenches is above said substrate.

10. The MOSFET of claim 8, wherein each of said trenches further extends into said substrate.

11. The MOSFET of claim 8 further comprises a plurality of avalanche enhancement doped regions of said second conductivity type within said body regions and below said source regions, each of said avalanche enhancement doped regions formed between a pair of said source regions and having a higher doping concentration than said body regions; and a plurality of shallow contact doped regions of said second conductivity type near the top surface of said body regions, each of said shallow contact doped regions formed between a pair of said source regions and onto said avalanche enhancement doped regions, said shallow contact doped regions having a higher doping concentration than said avalanche enhancement doped regions.

12. The MOSFET of claim 8 further comprises Guard Ring as termination area when breakdown voltage is less than or equal to 100V.

13. The MOSFET of claim 8 further comprises Guard Ring and multiple floating rings as termination area when breakdown voltage is larger than 100V.

14. The MOSFET of claim 8 further comprises source metal onto a third insulation layer and extend into contact regions between every two adjacent said third insulation layer to contact with said shallow contact doped regions and said source regions in active area or only shallow contact doped regions near by termination area.

15. A Method for manufacturing a super-junction trench MOSFET comprising the steps of:

growing an epitaxial layer of a first conductivity type upon a heavily doped substrate of a first conductivity type;

applying a trench mask to form a plurality of trenches by etching through said oxide layer, and into said epitaxial layer or through said epitaxial layer and into said substrate by successively dry oxide etch and dry silicon etch;

growing a sacrificial oxide layer onto inner surface of said trenches and removing said sacrificial oxide to remove the plasma damage;

growing a screen oxide along the inner surface of said trenches;

carrying out angle Ion Implantation of first conductivity type dopant and diffusion to form the first doped column regions between two adjacent sidewalls of said trenches;

carrying out angle Ion Implantation of second conductivity type dopant and diffusion to form the second doped column regions adjacent to the sidewalls of said trenches and in parallel surrounding said first doped column regions;

forming a first insulation layer along the inner surface of said trenches by thermal oxide growth or oxide deposition;

depositing first doped polysilicon filling said trenches and close to said insulation layer serving as source electrodes;

etching back said source electrodes and said first insulation layer from the upper portion of said trenches and from the top surface of said epitaxial layer;

growing a second insulation layer along the upper sidewalls of each of said trenches and onto the top surface of said source electrodes and said first insulation layer, said second insulation layer has a thinner thickness than said first insulation layer;

depositing second doped polysilicon filling the upper portion of said trenches and close to said second insulation layer to serving as gate electrodes;

etching back said gate electrodes by CMP (Chemical Mechanical Polishing) or Plasma Etch;

applying a body mask onto top surface of said epitaxial layer;

carrying out Ion Implantation of second conductivity type dopant and diffusion to form body region;

removing said body mask and applying a source mask onto top surface of said epitaxial layer;

carrying out Ion Implantation of first conductivity type dopant and diffusion to form source region; and removing said source mask and depositing a third insulation layer onto top surface of said epitaxial layer.

16. The method of claim 15 further comprises applying a contact mask onto top surface of said third insulation layer and etching contact holes by dry oxide etch to form contact regions; carrying out high energy Ion Implantation of second conductivity type dopant to form the avalanche enhancement doped regions; and carrying out blank Ion Implantation of second conductivity type dopant to form the shallow contact doped regions.

17. The method of claim 15 further comprises applying Guard Ring mask and carrying out Ion Implantation of second conductivity type dopant and diffusion to form Guard Ring before applying the body mask.

18. The method of claim 15 further comprises depositing metal layer onto top surface of third insulation layer and applying metal mask continued by etching metal layer to form source metal.

\* \* \* \* \*